(12) United States Patent
Lee et al.

(10) Patent No.: US 6,646,945 B1
(45) Date of Patent: Nov. 11, 2003

(54) REFERENCE VOLTAGE FILTER FOR MEMORY MODULES

(75) Inventors: Terry R. Lee, Boise, ID (US); George Pax, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 379 days.

(21) Appl. No.: 09/592,933

(22) Filed: Jun. 13, 2000

(51) Int. Cl.[7] .................................................. G11C 7/00
(52) U.S. Cl. .................................. 365/226; 365/189.09
(58) Field of Search ................................ 365/226, 227, 365/228, 189.09, 191

(56) References Cited

U.S. PATENT DOCUMENTS

| 5,710,740 A | * | 1/1998 | Manning | 365/222 |
| 6,101,142 A | * | 8/2000 | McLaury | 365/226 |
| 6,178,109 B1 | * | 1/2001 | Song et al. | 365/149 |

* cited by examiner

*Primary Examiner*—Vu A. Le
(74) *Attorney, Agent, or Firm*—Dickstein Shapiro Morin & Oshinsky, LLP

(57) ABSTRACT

A plug-in module, e.g., a memory module, for a bus system is disclosed. Each module includes a filter for filtering a reference voltage signal line, with the modules being arranged such that each of the filters in successive modules are cascaded.

36 Claims, 5 Drawing Sheets

REFERENCE VOLTAGE FILTER FOR MEMORY MODULES

FIELD OF THE INVENTION

The present invention relates to memory modules which are typically employed in a processor based bus system; and, more particularly, the present invention relates to a filtering technique for reducing noise voltage on a reference voltage path in the modules.

BACKGROUND OF THE INVENTION

There is an ever increasing trend to higher speed memory devices for use, for example, in processor based systems. In order to achieve high speed operation, data decisions within a memory device are often made based on a comparison of a data signal on a data path to a reference voltage $V_{Ref}$. To ensure accurate data detection, it is imperative that the reference voltage ($V_{Ref}$) be as stable and as reliable as possible.

Unfortunately, the reference voltage line in a bus system is subject to many interfering noise signals including noise signals originating from high speed switching circuits. These noise signals may impose an offset on the $V_{Ref}$ which, in turn, can cause improper data recognition by the memory devices, .i.e., memory chips, on a memory module which uses the $V_{Ref}$.

SUMMARY OF THE INVENTION

The present invention is directed to a memory system which includes a plurality of memory modules, each of which has a filter thereon for filtering a $V_{Ref}$ signal path. The filter is connected to a $V_{Ref}$ input terminal of the module. The output of the filter supplies a filtered $V_{Ref}$ signal to each of the memory devices on the module.

In another aspect, the filters of different memory modules may be cascaded together. To this end, the output of each filter is also connected to a filtered $V_{Ref}$ output terminal of the module.

DETAILED DESCRIPTION OF THE DRAWINGS

Figure 1:
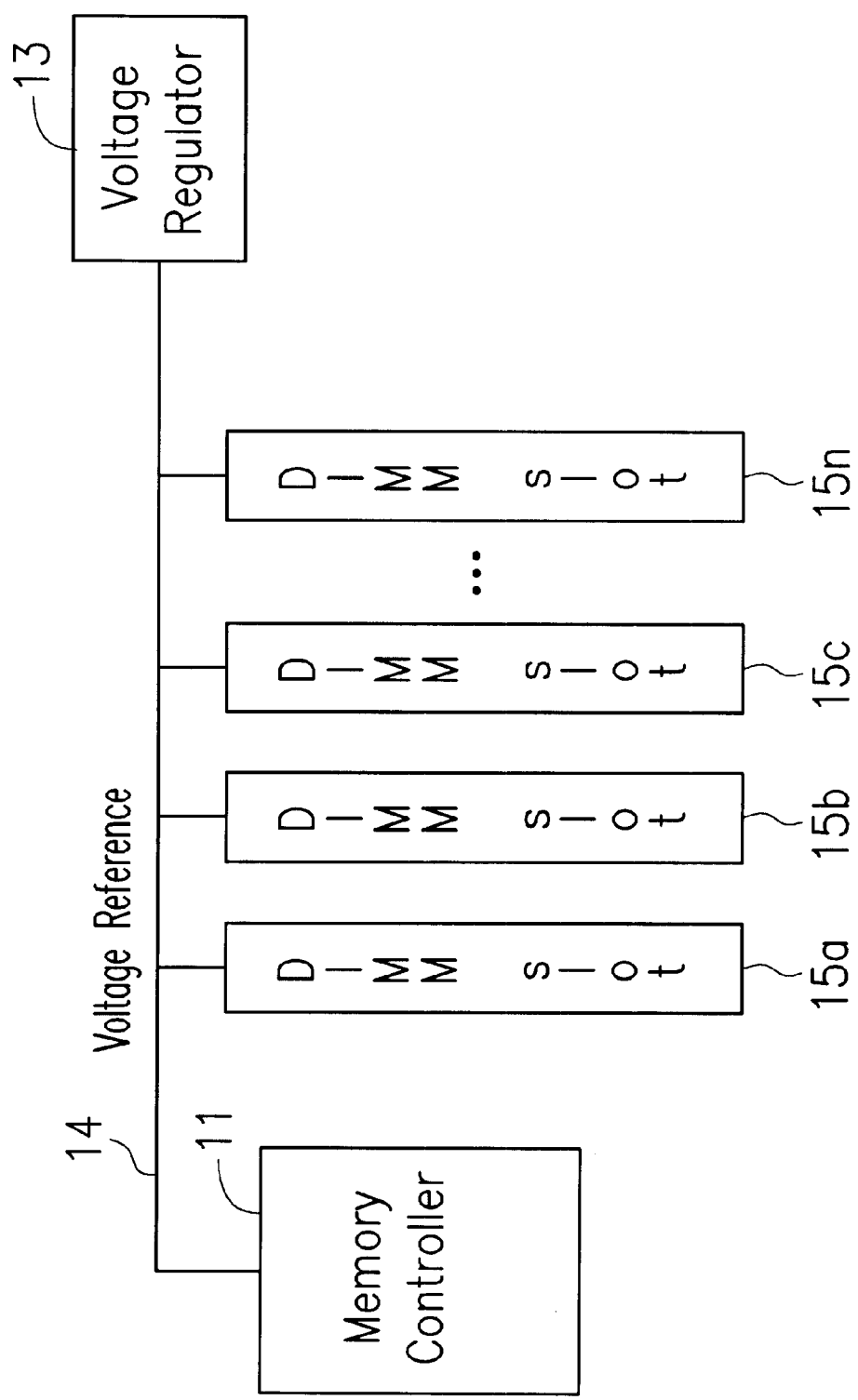
FIG. 1 illustrates a typical memory bus system.

A conventional memory bus system is illustrated in FIG. 1 and includes a memory controller 11 which is coupled via bus 14 to a plurality of memory modules $15_a \ldots 15_n$. The memory modules $15_a \ldots 15_n$ are coupled to the bus 14 through a plurality of bus connectors, for example, DIMM or SIMM sockets. A voltage regulator 13 is provided for regulating the reference voltage $V_{Ref}$ on the bus 14. It should be noted in FIG. 1 that only the $V_{Ref}$ bus line 14 is illustrated and that the remaining bus lines which couple the memory controller 11 to the memory modules $15_a \ldots 15_n$ are omitted.

Figure 3:
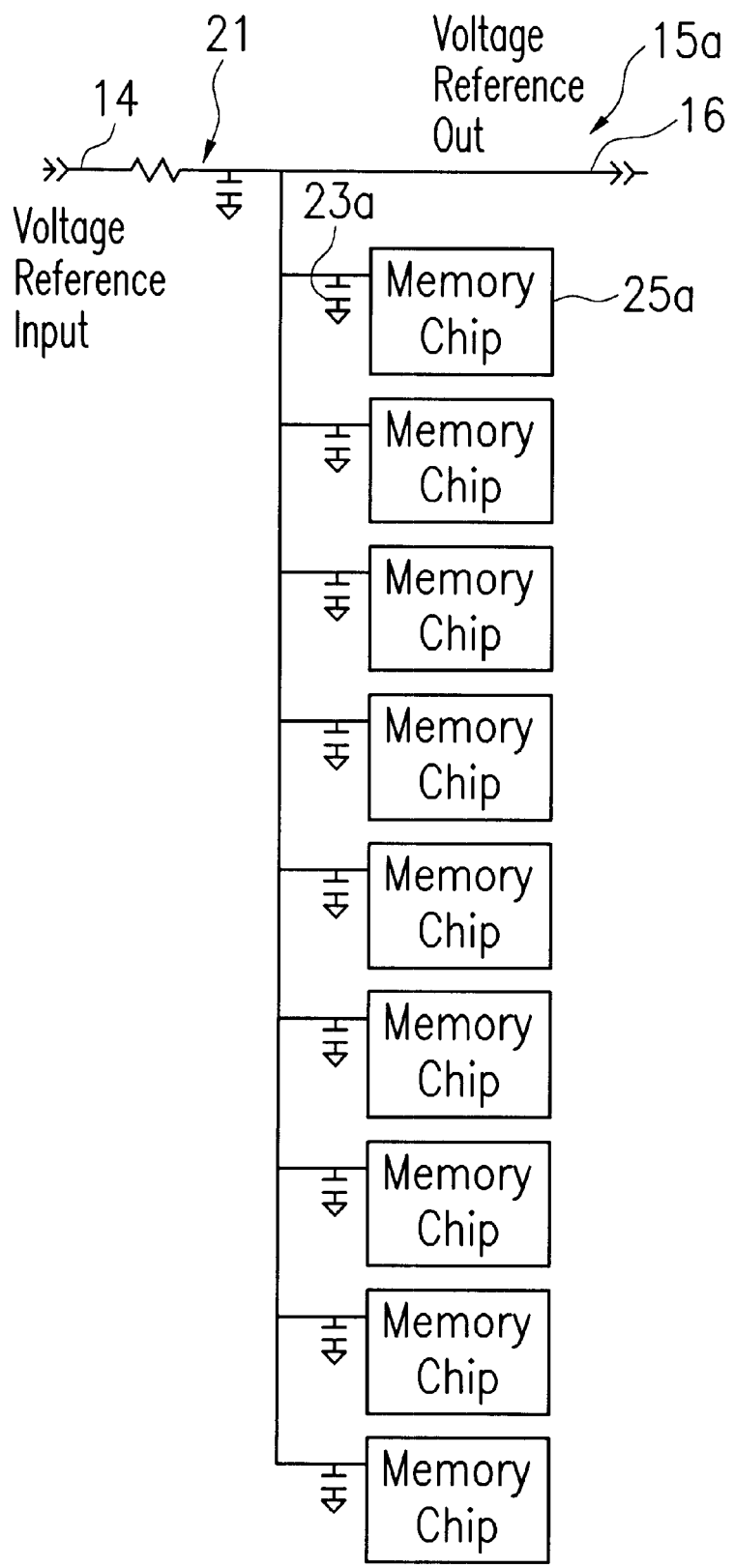
FIG. 3 illustrates a memory module used in the FIG. 2 system.

The invention provides a filter 21 on each memory module $15_a \ldots 15_n$. FIG. 3 illustrates a memory module $15_a$ which is representative of the memory modules $15_a \ldots 15_n$. Filter 21 is shown in FIG. 3 as a low pass filter which serves to filter out high frequency noise and other high frequency signals which may appear on the reference voltage line $V_{Ref}$ 14. As shown in FIG. 3, the filter 21 is provided on module input and supplies a filtered reference signal to each of the individual memory devices $25_a$ provided on the module $15_a$. FIG. 3 also illustrates conventional coupling capacitors $23_a$ which are associated with each of the memory devices $25_a$.

As also shown in FIG. 3, the filtered reference voltage is also provided as an output on line 16. The filtered reference voltage on output line 16 is applied back onto the $V_{Ref}$ line of the bus through a respective bus connector so that the low pass filter 21 of successive memory modules $15_a \ldots 15_n$ can be cascaded. In other words, the first memory module $15_n$, closest to the memory controller 11, receives a reference voltage which has been filtered by one low pass filter; the second module $15_{n-1}$ receives a reference voltage which has been filtered by the low pass filter of the first memory module $15_n$ as well as the low pass filter of the second memory module $15_{n-1}$, and so on. This filter cascading occurs through the bus connectors which have a pair of terminals which respectively connect with the input 25 and output 27 terminals of a respective module.

Figure 4:
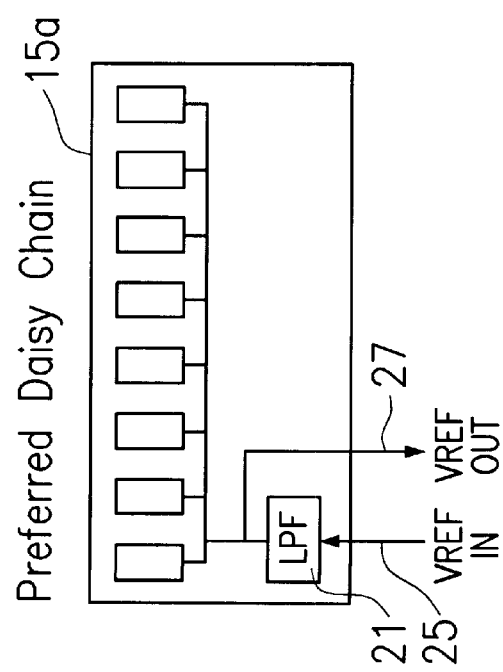
FIG. 4 further illustrates the FIG. 3 memory module.

FIG. 4 illustrates a memory module $15_a$ having a voltage reference input terminal 25, a low pass filter 21, which connects to each of the memory devices $25_a$, and an output terminal 27, which provides a filtered output voltage. As noted, it is preferred that the memory modules $15_a \ldots 15_n$ have their filters 21 cascaded so that the farthest memory module $15_a$ from the source of $V_{Ref}$ has more filtering than a memory module, e.g. $15_a$) closer to the source of $V_{Ref}$. Output terminal 27 and the associated bus connectors which are connected with the bus enable this cascading to occur.

Figure 2:
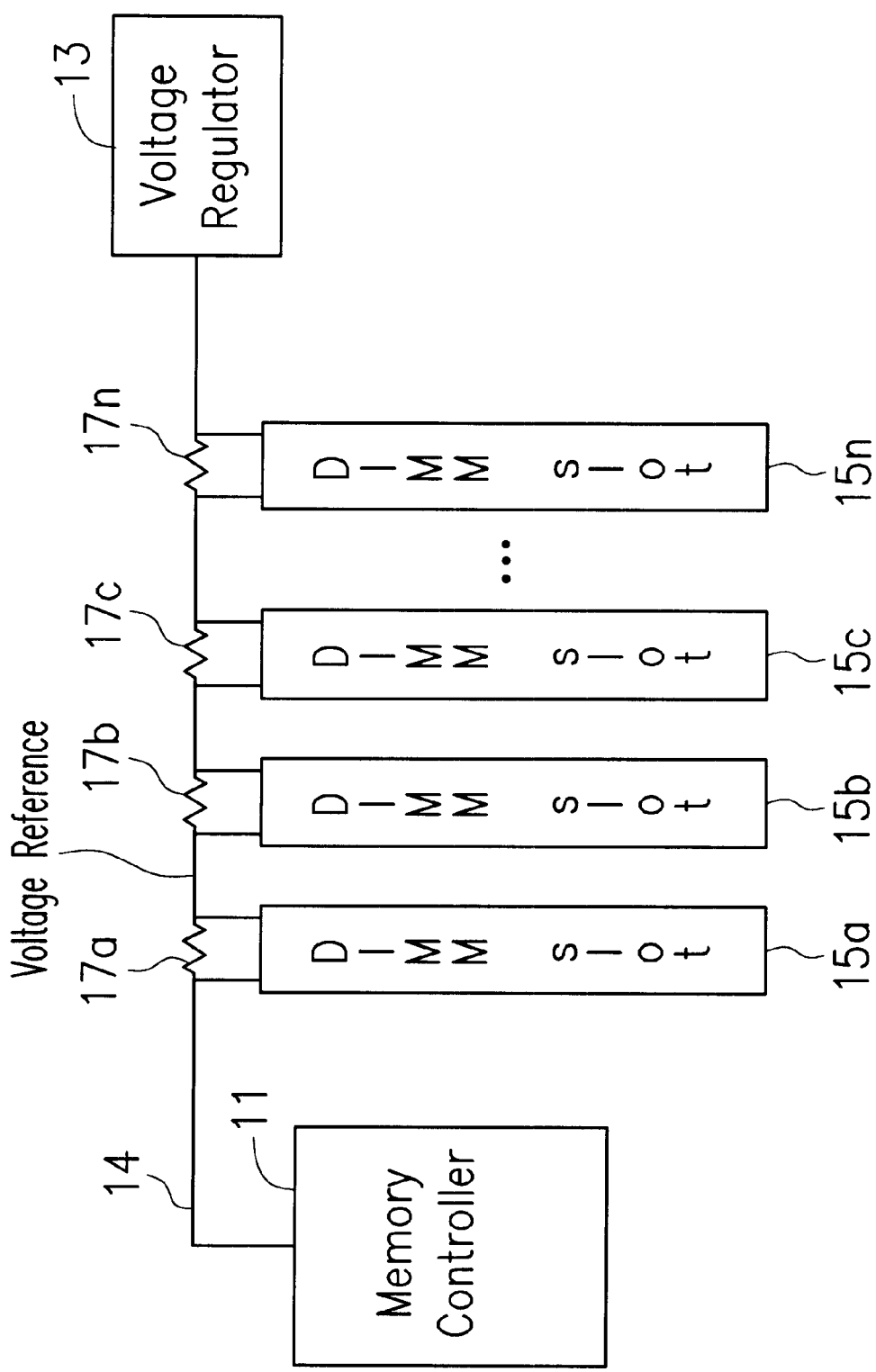
FIG. 2 illustrates a memory bus system employing the invention.
Figure 5:
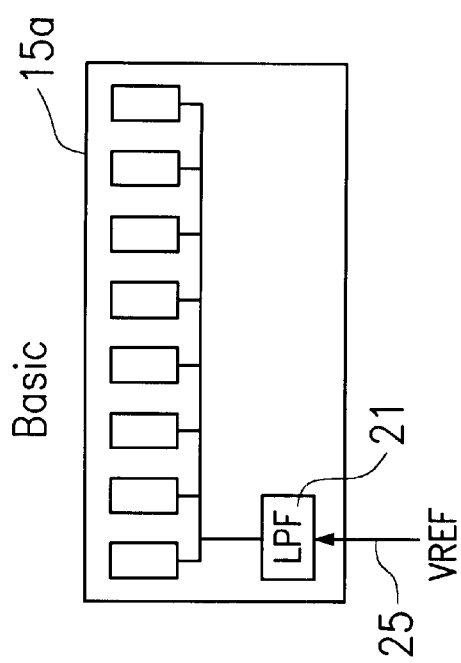
FIG. 5 illustrates a modified embodiment of the FIG. 4 memory module.

The invention is not restricted, however, to a cascaded low pass filter arrangement as illustrated in FIGS. 2, 3 and 4. FIG. 5 shows a memory module having a low pass filter in which the low pass filter cannot be cascaded from module-to-module, as no output terminal for the filtered $V_{Ref}$ signal is provided on the module.

FIG. 2 illustrates an arrangement where the memory systems are connected by inserting the modules $15_a \ldots 15_n$ into respective bus connectors of a main bus and where respective bypass resistors $17_a \ldots 17_n$ respectively associated with the connectors are employed to maintain continuity of the reference signal $V_{Ref}$ when a bus connector is unpopulated. The bypass resistors $17_a \ldots 17_n$ are provided between the pair of connector terminals which respectively connect with the input 25 and output 27 terminals of a module $15_a$. In some buses, where the bus continuity requires the insertion of a module or a jumper in a bus connector, the bypass resistors $17_a \ldots 17_n$ are not necessary.

The filter 21 which is employed in the invention is preferably a low pass filter to filter out high frequency noise signals which may be present on the voltage reference $V_{Ref}$ signal line and which may affect decisions of voltage logic level transitions at the memory devices $25_a \ldots 25_n$ which are provided on the memory modules $15_a \ldots 15_n$. It should be noted, however, that other types of filters can be used depending on the type of spurious signals which may be present on the voltage reference line 14.

The present invention provides for filtering of the $V_{Ref}$ input of a memory module in a memory system with the simple expedient of the addition of a filter on the memory module itself In addition, an additional filtered $V_{Ref}$ output pin on the memory module may be provided to enable cascading of the filters from module to module through the bus connectors. As a consequence, it is not necessary to provide a separate filter within and/or an additional pin on each of the memory devices $25_a$. This enables a filtering function to be achieved at relatively low cost and with minimal additional circuitry, and with no circuit changes to the memory devices $25_a$.

While the invention has been described with particular reference to a memory module, it should be noted that the provision of a filter on a module can be applied to other components of a computer and/or switching system, such as a network card, video card, or any plug-in card which requires a filtered reference voltage.

Figure 6:
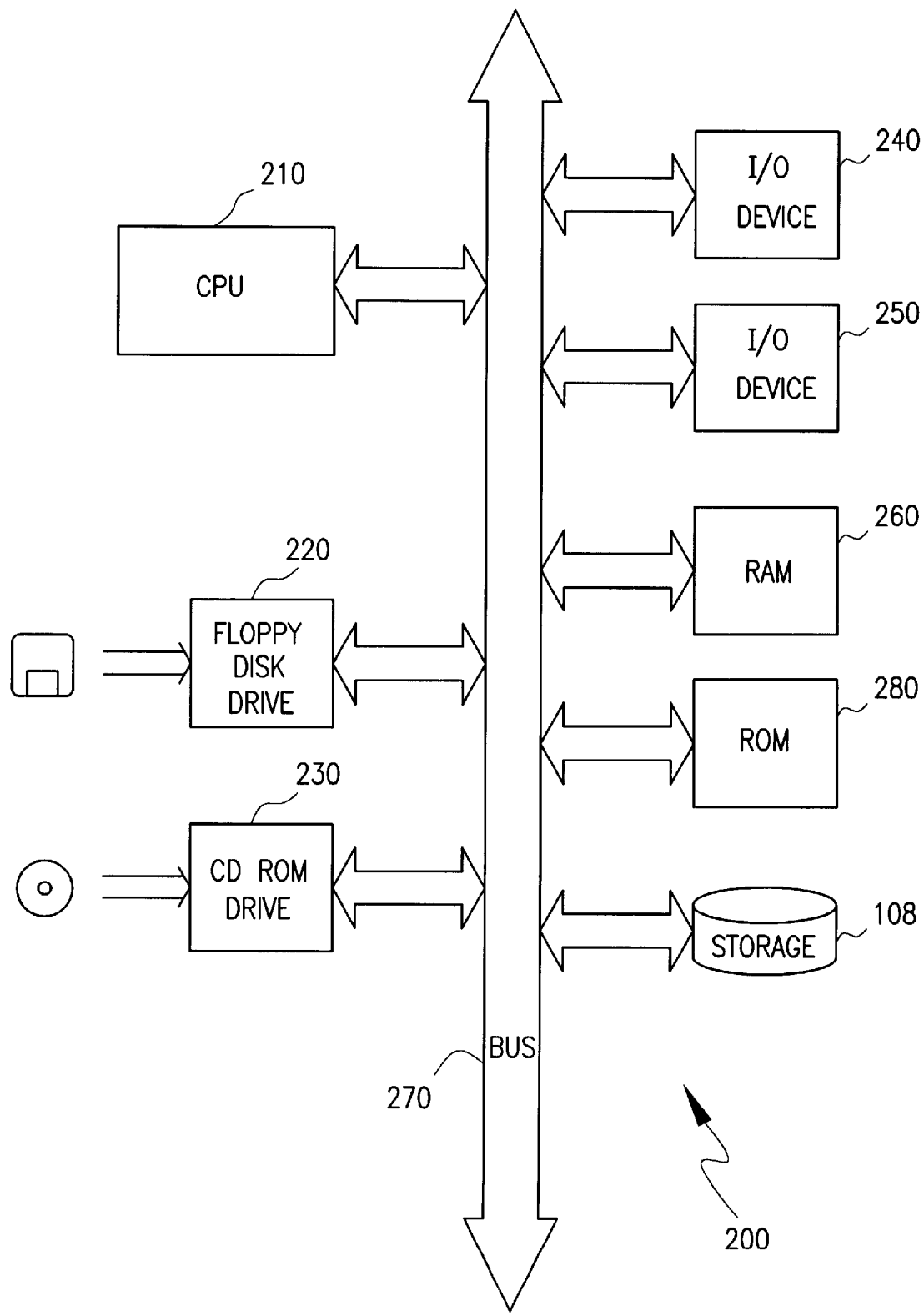
FIG. 6 illustrates a processor system which uses a memory bus system of FIG. 2.

FIG. 6 illustrates a processor based system employing a memory system which includes one or more memory module constructed in accordance with the invention.

As shown in FIG. 6, a processor based system, such as a computer system, for example, generally comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and, in the case of a computer system may include peripheral devices such as a floppy disk drive 220 and a compact disk (CD) ROM drive 230 which also communicate with CPU 210 over the bus 270. The RAM 260 is preferably constructed as a bus memory system having plug-in filtered modules as depicted in FIGS. 3, 4 or 5.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A memory module comprising:
    a memory module substrate for supporting at least one integrated circuit memory device;
    at least one integrated circuit memory device supported on said substrate, said memory device having a reference voltage input terminal;
    a filter provided on said substrate separate from said integrated circuit for filtering a reference voltage, an output of said filter being applied to said reference voltage input terminal;
    a reference voltage input terminal provided on said substrate and electrically connected to an input of said filter; and
    wherein said filter is a low pass filter.

2. A memory module comprising:
    a memory module substrate for supporting at least one integrated circuit memory device;
    at least one integrated circuit memory device supported on said substrate, said memory device having a reference voltage input terminal;
    a filter provided on said substrate separate from said integrated circuit for filtering a reference voltage, an output of said filter being applied to said reference voltage input terminal;
    a reference voltage input terminal provided on said substrate and electrically connected to an input of said filter; and
    wherein said filter attenuates high frequency noise present in said reference voltage.

3. A memory module comprising:
    a memory module substrate for supporting at least one integrated circuit memory device;
    at least one integrated circuit memory device supported on said substrate, said memory device having a reference voltage input terminal;
    a filter provided on said substrate separate from said integrated circuit for filtering a reference voltage, an output of said filter being applied to said reference voltage input terminal;
    a reference voltage input terminal provided on said substrate and electrically connected to an input of said filter;
    a reference voltage output terminal provided on said substrate which is electrically connected to the output of said filter; and
    a bus connector for receiving said memory module, said bus connector having first and second terminals respectively receiving said reference voltage input connection terminal and said reference voltage output connection terminal.

4. A memory module as in claim 3 wherein said first and second terminals have a resistance connected between them.

5. A memory module as in claim 3 wherein said first terminal receives a reference voltage from a reference voltage source, and said second terminal supplies a filtered reference voltage.

6. A memory system comprising:
    a bus;
    a plurality of connectors coupled to said bus, each having terminals for connecting said bus to a memory module;
    a plurality of memory modules respectively connected with said connectors, each of said memory modules comprising:
        a substrate;
        at least one memory device on said substrate, said memory device having a reference voltage input;
        a filter provided on said substrate for filtering a reference voltage, an output of said filter being applied to said reference voltage input;
        a reference voltage input terminal provided on said substrate and electrically connected to an input of said filter, said reference voltage input terminal receiving a reference voltage from a said connector.

7. A memory, system as in claim 6 further comprising a reference voltage output terminal provided on said substrate which is electrically connected to the output of said filter.

8. A memory system as in claims 6 or 7 wherein said filter is a low pass filter.

9. A memory system as in claim 6 wherein said filter attenuates high frequency noise present in said reference voltage.

10. A memory system as in claim 7 wherein each said connector has first and second terminals adapted to receive a said reference voltage input connection terminal and a said reference voltage output connection terminal.

11. A memory system as in claim 10 wherein said first and second terminals have a resistance connected between them.

12. A memory system as in claim 10 wherein said first terminal receives a reference voltage from a reference voltage bus line, and said second terminal supplies a filtered reference voltage to a reference voltage bus line.

13. A memory system as in claim 6 wherein each said module further comprises a plurality of said memory devices mounted on said substrate, each of said memory devices having a respective reference voltage input, the reference voltage inputs of said plurality of memory devices being electrically connected to said output of said filter.

14. A memory system as in claim 6 wherein said connectors are arranged such that if a memory module is not present in a said connector, a signal path for said reference voltage is maintained to all said connectors.

15. A memory system as in claim 14 further comprising a plurality of resistors coupled in said reference voltage signal path for maintaining continuity of said signal path even if one of said connectors does not have a memory module connected thereto.

16. A memory system as in claim 6 wherein the filters of said memory modules are connected in cascade through said connectors.

17. A bus system comprising:
    a plurality of signal lines, at least one of said signal lines supplying a first voltage signal;
    a plurality of connectors coupled to said plurality of signal lines, each having terminals for connecting a plug-in module to said signal lines;
    at least one plug-in module connected to one of said connectors, said plug-in module comprising:
        at least one device having an input for receiving said first voltage signal;
        a filter mounted on said module for connection to said at least one signal line for filtering said first voltage signal; and
        a reference voltage input connection terminal and a reference voltage output connection terminal mounted on said plug-in module for respective connection with mating terminals of a said connector, said reference voltage input connection terminal being electrically connected to an input of said filter and said reference voltage output connection terminal being connected to said output of said filter.

18. A system as in claim 17 wherein said plug-in module is a memory module.

19. A system as in claim 17 wherein said plug-in module is a plug-in card for a processor system.

20. A method of operating a memory module containing at least one integrated memory device, said method comprising:
    receiving a reference voltage at an input terminal of said memory module;
    filtering said reference voltage received at said input terminal of said memory module;
    applying the resulting filtered reference voltage to at least one input terminal of at least one integrated circuit memory device provided on said memory module; and
    providing said filtered reference voltage as an output signal of said memory module.

21. A method of operating a memory module containing at least one integrated, memory device, said method comprising:
    receiving a reference voltage at an input terminal of said memory module;
    filtering said reference voltage received at said input terminal of said memory module;
    applying the resulting filtered reference voltage to at least one input terminal of at least one integrated circuit memory device provided on said memory module; and
    wherein said filtering is a low pass filtering.

22. A method of operating a memory module containing at least one integrated memory device, said method comprising:
    receiving a reference voltage at an input terminal of said memory module;
    filtering said reference voltage received at said input terminal of said memory module;
    applying the resulting filtered reference voltage to at least one input terminal of at least one integrated circuit memory device provided on said memory module; and
    wherein said filtering filters high frequency noise present in said reference voltage.

23. A method as in claim 20 further comprising connecting a plurality of said modules to a bus system such that the filtering operation of at least some of said modules is cascaded.

24. A processor system comprising:
    a processor;
    a bus system coupled to said processor; and
    at least one memory module coupled to said bus system, said memory module comprising:
        a substrate;
        at least one memory device provided on said substrate, said memory device having a reference voltage input;
        a filter provided on said substrate for filtering a reference voltage, an output of said filter being applied to said reference voltage input;
        a reference voltage input terminal provided on said substrate, said reference voltage input connection terminal being connected to an input of said filter.

25. A system as in claim 24 further comprising a reference voltage output terminal mounted on said substrate which is electrically connected to said output of said filter.

26. A system as in claim 24 or 25 wherein said filter is a low pass filter.

27. A system as in claim 24 wherein said filter attenuates high frequency noise present in said reference voltage.

28. A system in claim 25 further comprising a bus connector having first and second terminals respectively receiving said reference voltage input connection terminal and said reference voltage output connection terminal.

29. A system as in claim 28 wherein said first and second terminals have a resistance connected between them.

30. A system as in claim 24 wherein said first terminal receives a reference voltage from a reference voltage source, and said second terminal supplies a filtered reference voltage.

31. A system as in claim 24 further comprising a plurality of said memory devices mounted on said substrate, each of said memory devices having a respective reference voltage input, the reference voltage inputs of said plurality of memory devices being electrically connected to said output of said filter.

32. A system as in claim 25 further comprising:
    a plurality of said memory modules; and
    a plurality of connectors for receiving respective memory modules and coupling them to said bus system, said connectors being arranged to connect the filters of said memory modules which are received in said connectors in cascade.

33. A system as in claim 32 further comprising a plurality of resistors respectively associated with said connectors for maintaining a reference voltage signal path through said connectors even if a memory module is not received therein.

34. A method of operating a memory module containing at least one integrated as memory device, said method comprising:

receiving a reference voltage at an input terminal of said memory module;

filtering said reference voltage received at said input terminal of said memory module;

applying the resulting filtered reference voltage to at least one input terminal of at least one integrated circuit memory device provided on said memory module; and wherein said memory module contains a plurality of integrated circuit memory devices thereon, said method further comprising applying the resulting filtered reference voltage to at least one input terminal of each of said plurality of memory devices.

35. A memory module comprising:

a memory module substrate for supporting at least one integrated circuit memory device;

at least one integrated circuit memory device supported on said substrate, said memory device having a reference voltage input terminal;

a filter provided on said substrate separate from said integrated circuit for filtering a reference voltage, an output of said filter being applied to said reference voltage input terminal;

a reference voltage input terminal provided on said substrate and electrically connected to an input of said filter;

a reference voltage output terminal provided on said substrate which is electrically connected to the output of said filter; and wherein said filter is a low pass filter.

36. A method of operating a memory module containing at least one integrate memory device, said method comprising:

receiving a reference voltage at an input terminal of said memory module;

filtering said reference voltage received at said input terminal of said memory module;

applying the resulting filtered reference voltage to at least one input terminal of at least one integrated circuit memory device provided on said memory module;

providing said filtered reference voltage as an output signal of said memory module; and wherein said is a low pass filtering.

* * * * *